(12) United States Patent
Bengtsson et al.

(10) Patent No.: US 8,829,453 B2
(45) Date of Patent: Sep. 9, 2014

(54) X-RAY DETECTION DEVICE

(75) Inventors: Tomas Bengtsson, Gothenburg (SE);
Bjorn Cederquist, Gothenburg (SE);
Lars Herrnsdorf, Lindome (SE)

(73) Assignee: RTI Electronics AB, Molndal (SE)

( * ) Notice: Subject to any disclaimer, the term of this patent is extended or adjusted under 35 U.S.C. 154(b) by 0 days.

(21) Appl. No.: 13/376,168

(22) PCT Filed: Jun. 5, 2009

(86) PCT No.: PCT/SE2009/050681
§ 371 (c)(1),
(2), (4) Date: Jan. 9, 2012

(87) PCT Pub. No.: WO2010/140944
PCT Pub. Date: Dec. 9, 2010

(65) Prior Publication Data
US 2012/0126133 A1 May 24, 2012

(51) Int. Cl.
*G01T 1/24* (2006.01)
*G01T 1/02* (2006.01)
*H01L 31/118* (2006.01)
*H01L 31/115* (2006.01)

(52) U.S. Cl.
CPC ............ *H01L 31/1185* (2013.01); *G01T 1/026* (2013.01); *H01L 31/115* (2013.01)
USPC .................................................. 250/370.09

(58) Field of Classification Search
USPC ..................................... 250/370.09
See application file for complete search history.

(56) References Cited

U.S. PATENT DOCUMENTS

| 3,669,095 | A |   | 6/1972  | Kobayashi et al. |
|-----------|---|---|---------|------------------|
| 4,484,076 | A | * | 11/1984 | Thomson ................. 250/370.07 |
| 5,115,134 | A | * | 5/1992  | Slowey .......................... 250/374 |
| 5,216,700 | A |   | 6/1993  | Cherian |
| 5,444,254 | A | * | 8/1995  | Thomson ................. 250/370.07 |
| 5,652,899 | A |   | 7/1997  | Mays et al. |

(Continued)

FOREIGN PATENT DOCUMENTS

WO  WO 02/063338 A1  8/2002
WO  WO 2009/022378 A1  2/2009

OTHER PUBLICATIONS

Herrnsdorf, L. et al. 2009 "Point dose profile measurements using solid-state detectors in characterization of Computed Tomography systems" *Nuclear Instruments and Methods in Physics Research Section A* 607: 223-225.

(Continued)

*Primary Examiner* — David Porta
*Assistant Examiner* — Djura Malevic
(74) *Attorney, Agent, or Firm* — Knobbe, Martens, Olson & Bear, LLP

(57) ABSTRACT

The invention concerns an X-ray detection device, comprising: a semiconducting X-ray detecting member provided with first and second electrode contacts; first and second electric wires connected to the first and second electrode contacts, respectively; a dose adjusting element comprising tissue equivalent material, wherein the dose adjusting element is arranged such as to surround the detecting member with tissue equivalent material; and a shielding member configured to provide an electric shield for the detecting member and to protect the detecting member from being exposed to light. The invention is characterized in that the first electrode contact is positioned on the same side of the detecting member as the second electrode contact.

12 Claims, 4 Drawing Sheets

(56) References Cited

U.S. PATENT DOCUMENTS

| | | | |
|---|---|---|---|
| 6,097,978 A | 8/2000 | Demarais et al. | |
| 6,478,462 B2 | 11/2002 | Polkus et al. | |
| 6,510,336 B1 * | 1/2003 | Daghighian et al. | 600/427 |
| 7,612,369 B2 * | 11/2009 | Stasiak | 257/40 |
| 7,932,828 B2 * | 4/2011 | Britton et al. | 340/572.1 |
| 2001/0032933 A1 | 10/2001 | Thomson et al. | |
| 2003/0030065 A1 | 2/2003 | Wu | |
| 2004/0263535 A1 | 12/2004 | Birkenbach et al. | |
| 2006/0118701 A1 | 6/2006 | Sandrik et al. | |
| 2006/0285646 A1 | 12/2006 | Unfors | |
| 2008/0093560 A1 * | 4/2008 | Puhakka et al. | 250/370.08 |
| 2009/0028291 A1 | 1/2009 | Graumann | |
| 2010/0090118 A1 * | 4/2010 | Rozenfeld | 250/370.07 |
| 2010/0193695 A1 * | 8/2010 | Yeow et al. | 250/370.07 |
| 2011/0024640 A1 * | 2/2011 | Kahilainen et al. | 250/370.07 |

OTHER PUBLICATIONS

Letourneau, D. et al. 2007 "Integral test phantom for dosimetric quality assurance of image guided and intensity modulated stereotactic radiotherapy" *Med Phys* 34:1842-1849.

Search Report for Corresponding Chinese Application No. 200980159671.X dated May 20, 2013 (in 2 pages).

* cited by examiner

X-RAY DETECTION DEVICE

TECHNICAL FIELD

This invention relates to an X-ray detection device. In particular, the invention relates to an X-ray detection device for CT dose profile measurements.

BACKGROUND OF THE INVENTION

Of all the artificial X-ray sources, medical radiation sources supply the largest dose to the human population, and of these, Computed Tomography (CT) contributes to 70% of the total dose. A CT examination gives 10-50 times more dose to a patient than corresponding conventional examinations, and therefore quality control is important and should be made regularly.

The absorbed dose to a patient is the result of both primary radiation and scattered radiation from the surrounding tissue. For quality assurance, measurements of the dose from CT are performed in a phantom in order to include internal scattered radiation within the body. Dose measurements are traditionally done with a 100-mm-long, pencil-shaped ionisation chamber. However, at present a CT with beam collimation of up to 160 mm is available, which results in an incomplete measurement of the primary radiation using the standard ion chamber. Measuring the dose profile can be done using thermo luminescent dosimeters (TLD), optically stimulated luminescence (OSL), or X-ray film [3]. Drawbacks of these methods are that they are either expensive, time consuming or obsolete.

Recently, it has been proposed the use of a semiconductor detector diode for point dose measurement. Semiconductor X-ray detectors are as such well known and generally comprise a relatively flat detecting portion with back and front electrode contacts arranged on opposite sides of the detecting portion. The semiconductor detector proposed is made of Si and arranged in a PMMA (poly methyl methacrylate) rod that in turn is arranged in an aluminium cylinder. This type of detection device has e.g. the potential of having a much higher sensitivity than a small ion chamber.

Commercially available solid-state detectors for point dose measurements are typically mounted in a package with a high Z material acting as the back contact causing unsymmetrical response, which is a major drawback in a CT dose profile application. As described by Herrnsdorf et al. (L. Herrnsdorf et al., Nucl. Instr. and Meth. A (2009), doi:10.1016/j.nima.2009.03.159), substituting this high Z back contact with aluminium back and front contacts, and mounting the detector diode in parallel to the incoming radiation, improved the device considerably with regard to dose and dose profile measurements.

Although this improved detection device works reasonably well it is still a need for improvements, it is for instance desired to further improve the symmetry of the response and to further reduce the angle dependency.

SUMMARY OF THE INVENTION

An object of this invention is to provide an X-ray detection device for dose measurements that exhibit improved properties compared to known devices of this type. This object is achieved by the device defined by the technical features contained in independent claim 1. The dependent claims contain advantageous embodiments, further developments and variants of the invention.

The invention concerns an X-ray detection device comprising: a semiconducting X-ray detecting member provided with first and second electrode contacts; first and second electric wires connected to the first and second electrode contacts, respectively; a dose adjusting element comprising tissue equivalent material, wherein the dose adjusting element is arranged such as to surround the detecting member with tissue equivalent material; and a shielding member configured to provide an electric shield for the detecting member and to protect the detecting member from being exposed to light. The invention is characterized in that the first electrode contact is positioned on the same side of the detecting member as the second electrode contact.

Conventionally, the electrode contacts are provided on opposite sides of a semiconducting detector with the electric wires extending in opposite directions. This is a rather natural way of designing the detector since it allows for a large active detection volume, large electrode contacts and a simple production. However, in the type of detection device discussed here it is most convenient if the wires extend in the same direction so that it easily can be inserted and taken out from phantoms. This can be done simply by bending one of the wires and let it extend in the reversed direction. However, this means that the bent wire must extend through the radiation field between a radiation source and the detecting member. The wires used for this purpose are normally made of gold and in spite of their small diameter it has been discovered that a wire extending through the radiation field has an effect on the dose measured by the detecting member. Thus, a wire positioned in such a way has an effect on the rotational response of the detecting member in e.g. CT dose profile measurements (rotation around the z-axis).

The inventive X-ray detection device has the advantageous effect that it allows the two electric wires to extend in the same direction from/to the detecting member but at the same time avoid that any of the wires has to be positioned in the radiation field around the detecting member.

In an embodiment of the invention, an electrically non-conducting oxide passivation zone is provided between the first and second electrode contacts.

In a further embodiment of the invention, the detecting member has a flat shape with two main, substantially parallel surfaces, wherein the first and second electrode contacts are positioned on one of said main surfaces. Preferably, the device has an elongated shape, wherein the detecting member is arranged such that the main surfaces face in a longitudinal direction of the device.

An elongated design is advantageous for fitting into openings of standard phantoms. That the main surfaces of the detecting member face in a longitudinal direction means that the detecting member is positioned on its edge in the device and when such a device is placed in such a phantom opening the detecting member becomes positioned parallel to the incoming radiation during normal operation. Thereby, the detecting member achieves an almost constant sensitivity, independent of which side is irradiated.

In a further embodiment of the invention the device is provided with a density variation in a region close to the detecting member. A detecting member of the type used here is normally small and difficult to see on an X-ray image. By providing the device with a density variation, i.e. a region with a density that differs from the density of adjacent regions and which therefore can be seen on X-ray images, in a region close to the detecting member it is possible to determine the position of the detecting member by the use of X-rays. This is for instance of interest when adjusting the position of the device in a phantom. Such density variations can also be used when controlling/adjusting the position of the detectors of e.g. a CT-apparatus.

In a further embodiment of the invention the density variation is achieved by providing a cavity that surrounds the detecting member.

In a further embodiment of the invention, wherein the device has an elongated shape and wherein a flat detecting member is arranged with its main surfaces facing in a longitudinal direction of the device, the cavity has an annular shape and surrounds the detecting member in a radial direction of the device.

This particular design has the advantage that it reduces the angular dependency of the detecting member. As an X-ray source moves in the longitudinal direction of the device (i.e. along the z-axis) towards the detecting member, the angle between the main surfaces of the detecting member and the X-ray source increases, i.e. the effective detector area of the detecting member becomes smaller for geometrical reasons. In a conventional device, an effect of this is that the sensitivity of the detecting member decreases in a significant manner when the X-ray source is positioned relatively close to the detecting member (in the z-direction). A dip in detection sensitivity is reached when the X-ray source is positioned straight above (or below or at the side of) the detecting member when only the thin side of the flat detecting member is facing the X-ray source. By providing the device with an annular cavity that surrounds the detecting member in a radial direction of the device this angular dependency of the sensitivity can be reduced since the absence of material (that allow X-rays to pass through) compensates for the decrease in effective detector area. This way the effect of angular dependency can be reduced from around 5% to less than 1%. Preferably, the annular cavity has a width that is slightly larger than the thickness of the detecting member. In other words this means that it is preferable that the annular cavity has an extension in the longitudinal direction that is slightly larger than that of the detecting member. This way the angular dependency can be reduced to a minimum.

In a further embodiment of the invention the dose adjusting element surrounds the detecting member wherein the cavity is formed by a cut-out in the dose adjusting element.

The term "tissue equivalent material" is an established term which does not require that the material has exactly the same properties as tissue with regard to radiation interaction. The properties are, however, sufficiently similar.

BRIEF DESCRIPTION OF DRAWINGS

In the description of the invention given below reference is made to the following figure, in which.

DESCRIPTION OF EXAMPLE EMBODIMENTS OF THE INVENTION

Figure 1:
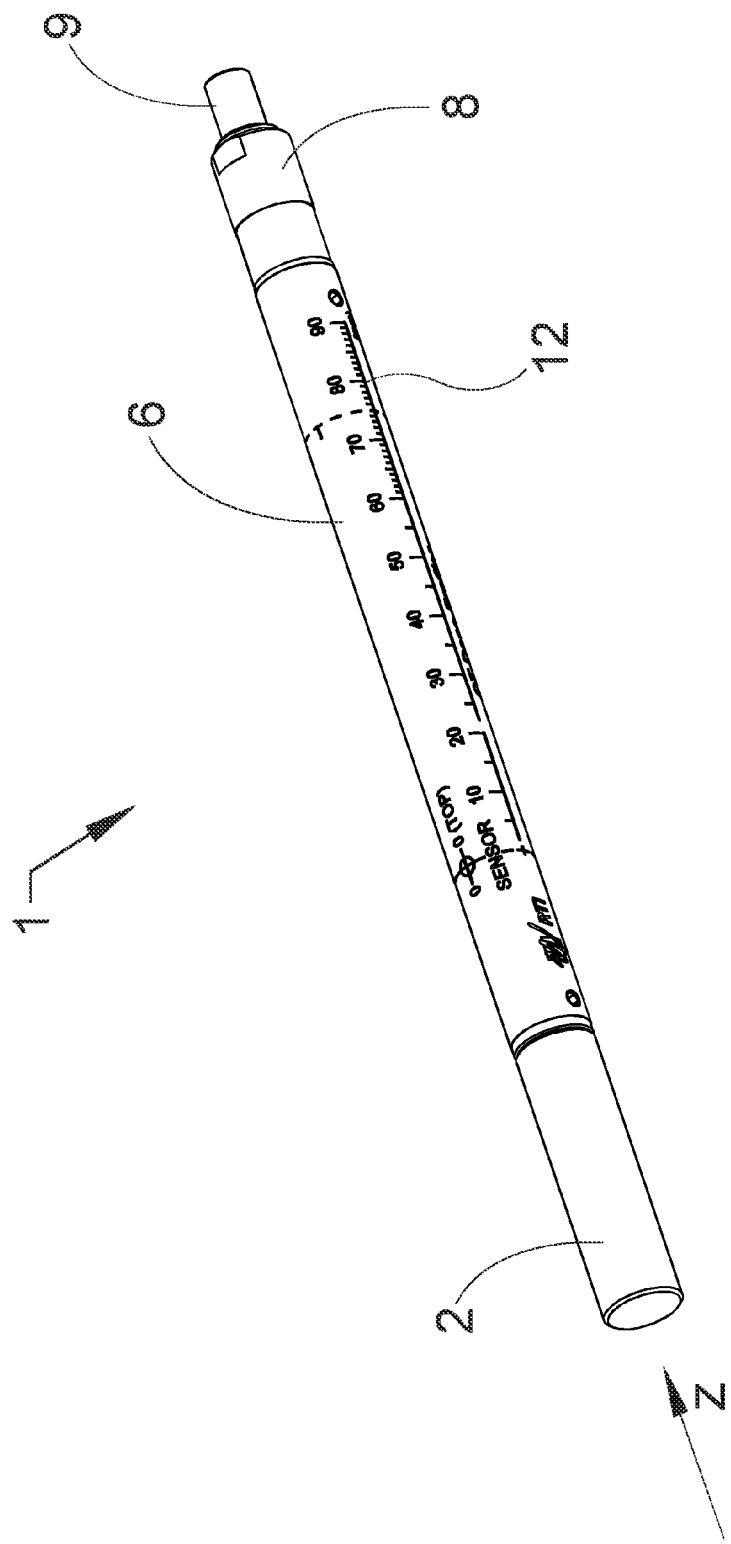
FIG. 1 shows, in a perspective view, a preferred embodiment of an inventive X-ray detection device.

FIG. 1 shows, in a perspective view, a preferred embodiment of an inventive X-ray detection device 1. As shown in FIG. 1, the device 1 has the shape of a rather long and narrow circular cylinder adapted to fit into standard phantoms. A mm-scale 12, which is used for position adjustments of the device 1, indicates the dimensions of the device 1. A semiconducting X-ray detecting member 15 (see FIG. 2) is positioned inside the device 1 at the zero mark of the scale 12.

As shown in FIG. 1, main outer components of the exemplified X-ray detection device 1 are a replaceable supplement body 2, a shielding member 6 in the form of an aluminium cylinder, a back body 8, and a rear plug 9 including an electric contact (not shown) for connecting the device 1 electrically to external electronic equipment (not shown).

Figure 2:
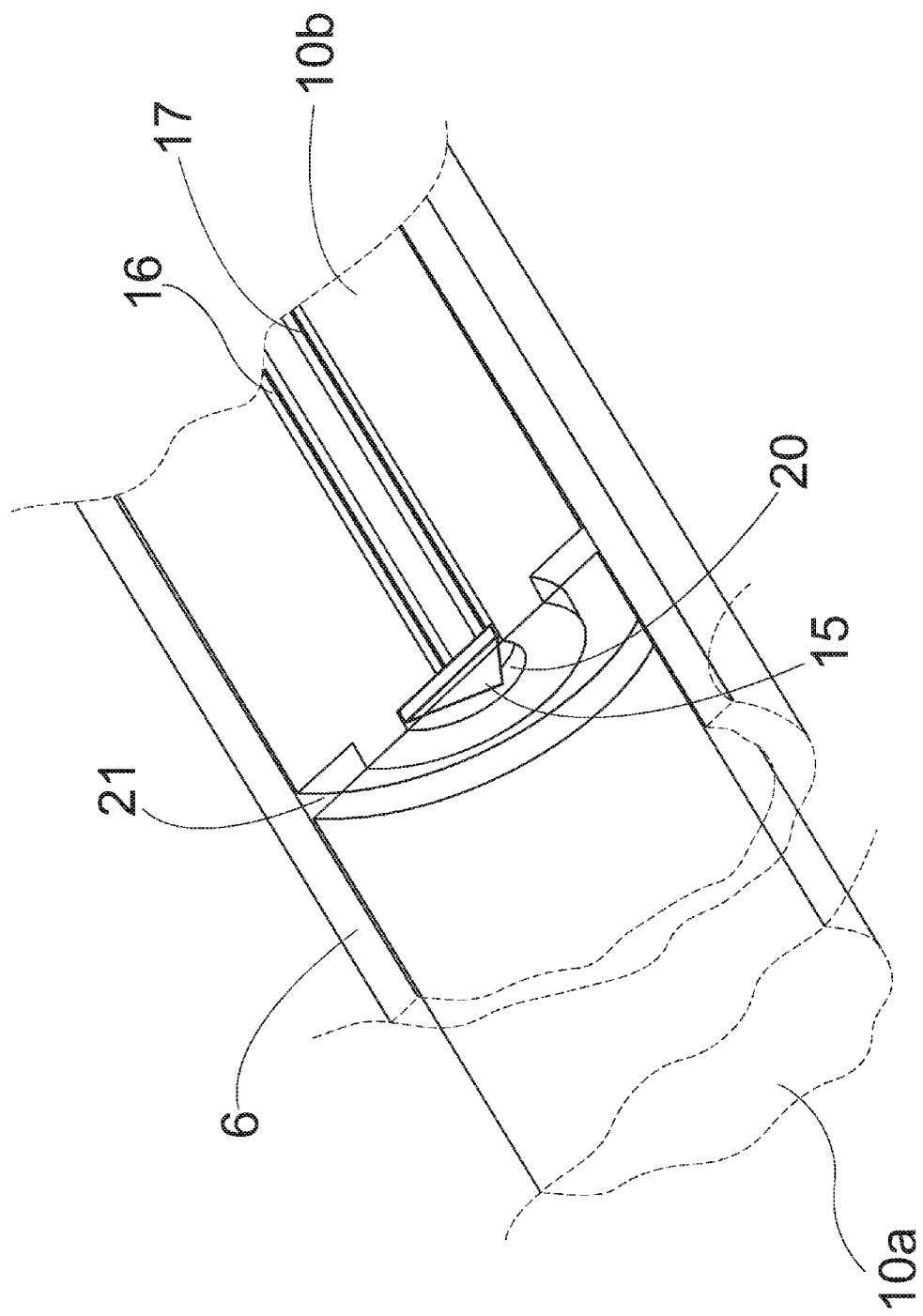
FIG. 2 shows, in a sectional, perspective view, a part of the embodiment according to FIG. 1.

FIG. 2 shows, in a sectional, perspective view, a part of the embodiment according to FIG. 1. FIG. 2 shows that the device further comprises a dose adjusting element 10 made of PMMA (polymethyl methacrylate) including a front and a rear element 10a, 10b that are coaxially mounted together (e.g. glued together) during assemblage and adapted to fit into the shielding member 6. The dose adjusting element 10 surrounds the semiconducting X-ray detecting member 15, which is arranged in a central, circular cavity 20 provided in the rear dose adjusting element 10b. FIG. 2 also shows first and second electric wires 16, 17 for connecting the detecting member 15 to the electric contact in the rear plug 9.

The element 10a is shown transparent such as to clearly show the detecting member 15.

In addition to what is shown in FIGS. 1 and 2, the inventive device 1 described here comprises various screws, plugs, seals, etc. These components are not further described since there are many ways of putting together a device of this type.

As indicated above, external electronic equipment (not shown) for analyzing the signals generated by the detecting member 15 upon X-ray exposure can be connected to said electric contact in the rear plug 9.

FIG. 2 further shows that the rear dose adjusting element 10b, in addition to the central cavity 20 for receiving the detecting member 15, is provided with an annular cut-out 21 that surrounds the detecting member 15 in a radial direction when the device 1 is assembled. The rear dose adjusting element 10b further comprises channels (partly shown in FIG. 2) for housing the wires 16, 17.

A main function of the shielding member 6 is to provide an electric shield for the detecting member 15. Another main function is to protect the detecting member 15 from being exposed to light. The type of shielding member 6 used in this case, an aluminium cylinder, provides both these functions.

A main function of the dose adjusting element 10 (which is regarded to form a single element when the two parts 10a and 10b are connected to each other) is to improve the dose measurements by providing a surrounding to the detecting member 15 that scatter X-rays in a similar way as tissue. This is achieved by making the dose adjusting element 10 out of a tissue equivalent material, in this case PMMA, and by positioning the dose adjusting element 10 such as to be in close vicinity of and surround the detecting member 15. When the front and rear dose adjusting elements 10a, 10b are put together the detecting member 15 is fully surrounded by tissue equivalent material and more or less clamped in place (see FIG. 2). Thus, a further function of the dose adjusting element 10 in the embodiment described here is to hold the detecting member 15 in place.

In FIG. 2 it can be seen that the detecting member 15 has a shape like a flat box and that it is positioned edgeways with its larger sides, i.e. its two main substantially parallel surfaces, facing in an axial direction of the device 1.

Further, FIG. 2 shows the annular cut-out 21 that surrounds the detecting member 15 in a radial direction of the device 1. The cut-out 21 is a removal of material that provides the device 1 with a density variation in a region close to the detecting member 15, which density variation is detectable by X-ray radiation. When adjusting the device 1 axially in a dose measurement it is helpful to know exactly where the detecting member 15 is positioned. Detecting members of the type described here are difficult to "see" with X-rays but the position of the cut-out 21 can be determined and thus allows positioning of the device.

A further advantage of the cut-out or air-cavity 21 is that it reduces the angular dependency of the detecting member. When an X-ray source moves along, but at a distance from the longitudinal axis of the device 1 (i.e. along the z-axis) towards the detecting member 15, the angle between the main surfaces of the detecting member 15 and the X-ray source increases, i.e. the effective detector area of the detecting member 15 becomes smaller for geometrical reasons. Without the cut-out 21 the sensitivity of the detecting member 15 would decrease and reach a minimum when the X-ray source becomes positioned straight above (or below or at the side of) the detecting member 15, at which point only the thin side of the flat detecting member 15 is facing the X-ray source. The cut-out 21 reduces this angular dependency since the absence of material in the cut-out 21 allow X-rays to pass through to a higher degree than if there would not have been any cut-out, and this compensates for the decrease in effective detector area. This way the effect of angular dependency can be reduced from around 5% to less than 1%.

Preferably, the annular cavity 21 has a width that is slightly larger than the thickness of the detecting member 15. In other words this means that it is preferable that the annular cavity 21 has an extension in the longitudinal direction that is slightly larger than that of the detecting member 15. This way the angular dependency can be reduced to a minimum. The depth of the cut-out 21, i.e. its extension in the radial direction of the device 1, is in case around 2 mm but may be adapted to the particular application (dimensions of detector member, material used in the dose adjusting element etc.).

Figure 3:
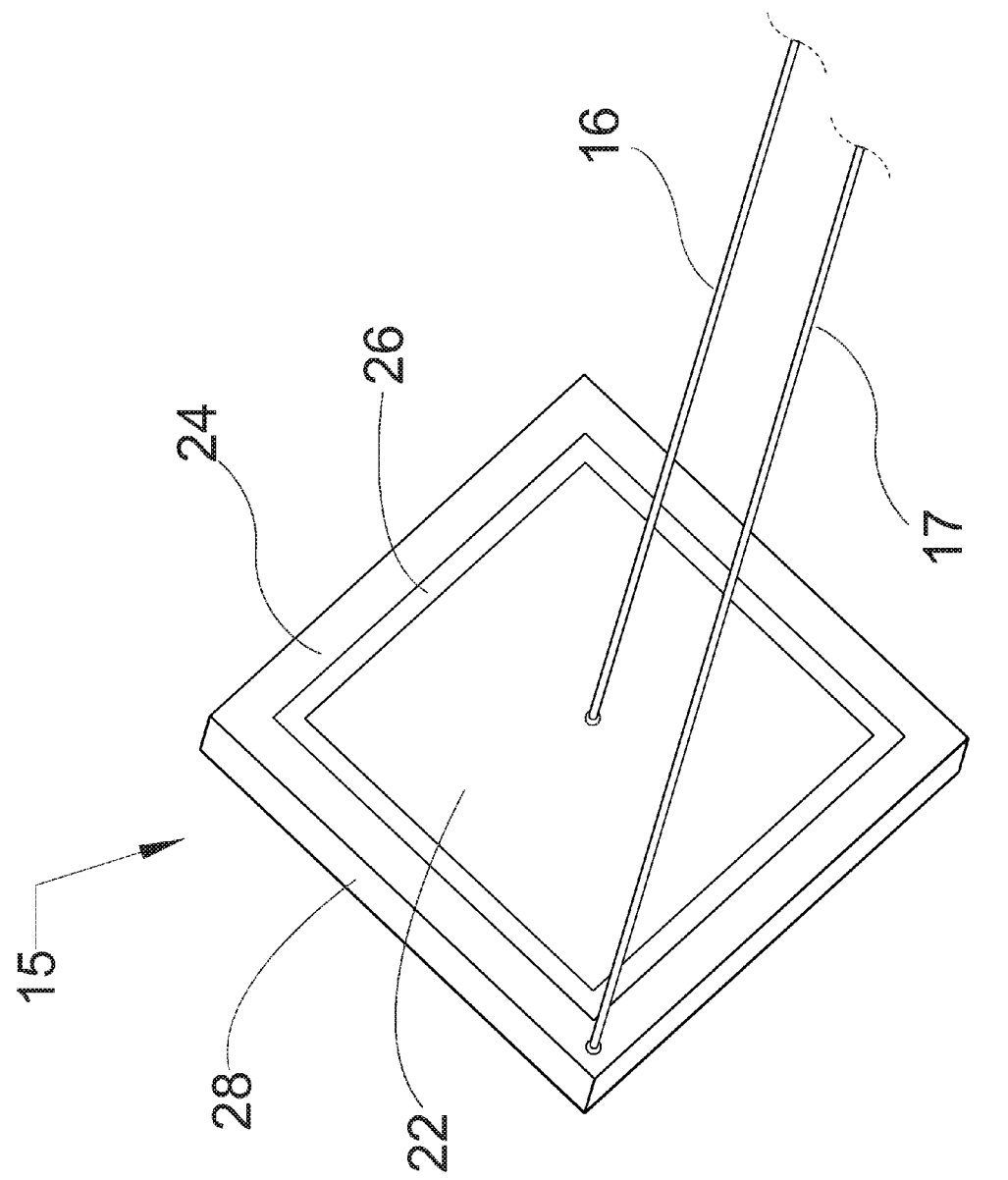
FIG. 3 shows, in a perspective view, a semiconducting X-ray detecting member of the inventive X-ray detection device.

FIG. 3 shows, in a perspective view, the detecting member 15 of the inventive X-ray detection device shown in FIG. 2. The detecting member 15 is a flat body with two main surfaces, a front side and a back side, that are substantially parallel to each other. FIG. 3 shows, slightly from above, the back side of the detecting member 15, i.e. in relation to FIG. 2 it is seen from the right. In this particular example the detecting member 15 has the shape of a square plate with side lengths of around 2 mm and a thickness of around 350 μm (which is a typical thickness of a semiconductor wafer).

A main body 28 of the detecting member 15 comprises lightly n-doped silicon substrate adapted for use in detectors of the type described here. Both a first electrode contact 22 and a second electrode contact 24 are arranged on the back side of the detecting member 15. The first electrode contact 22 includes a highly p-doped surface covered with a thin layer of aluminium. The second electrode contact 24 includes a highly n-doped surface covered with a thin layer of aluminium. The first and second electric wires 16, 17 are electronically connected to the first and second electrode contacts 22, 24, respectively. An electrically non-conducting oxide passivation zone 26 is positioned between the two electrode contacts 22, 24.

The first electrode contact 22 has a rectangular shape whereas the second electrode contact 24 forms a frame outside of the first electrode contact 22. The passivation zone 26 forms an inner frame between the first and second electrode contacts 22, 24.

Figure 4:
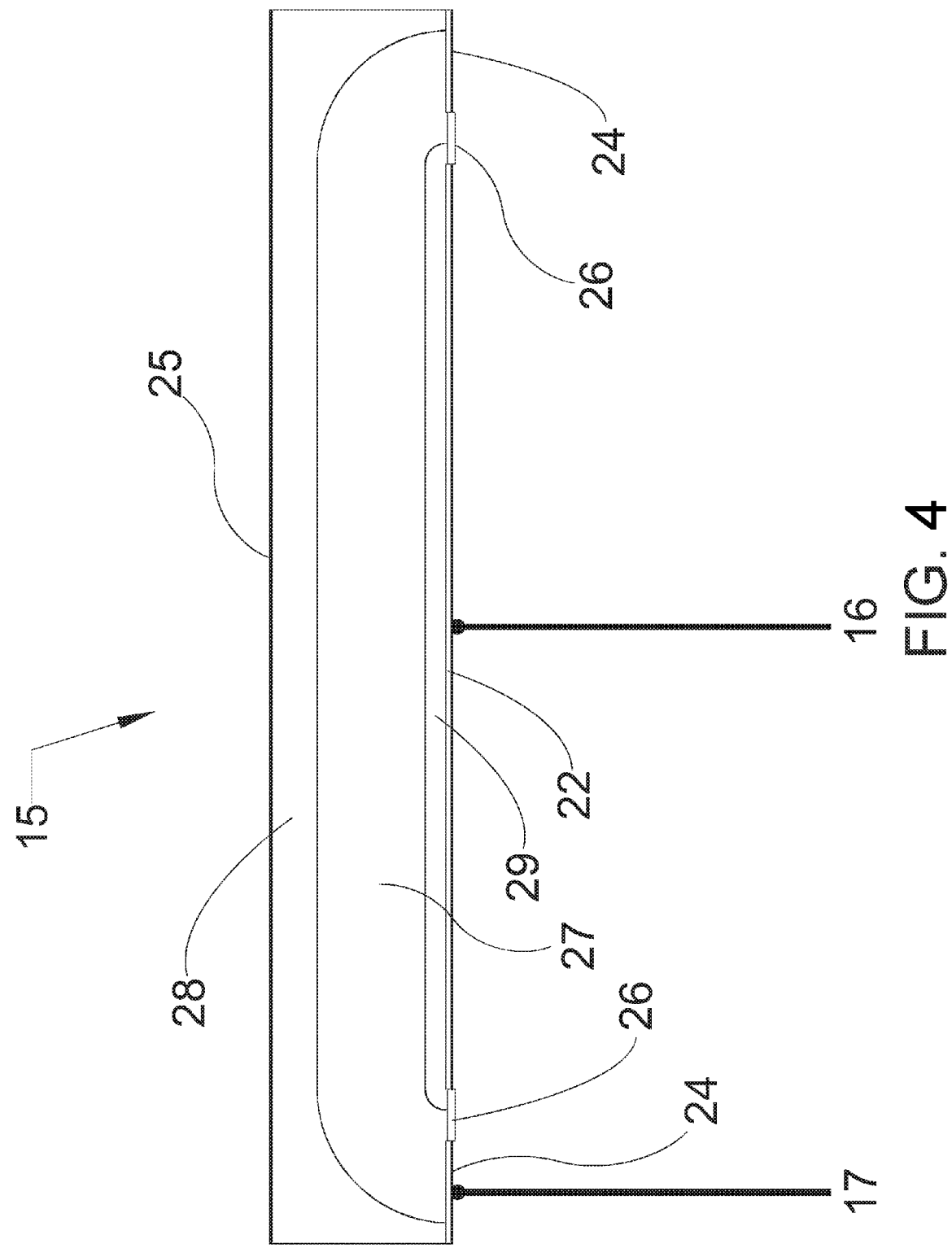
FIG. 4 shows, in a schematic sectional view, the detecting member shown in FIG. 3.

FIG. 4 shows, in a schematic sectional view, the detecting member 15 shown in FIG. 3. In addition to what is described in relation to FIG. 3, FIG. 4 indicates roughly a position of a diffusion zone 27 that forms part of the main body 28 of the detecting member 15. X-ray interaction inside this diffusion zone 27 can be detected. A so-called depletion zone 29 is also indicated. FIG. 4 also shows a thin layer 25 of aluminium provided on the front side of the detecting member 15.

The individual parts and components of the detecting member 15, as well as their methods of production, are in principal known. For instance, semi-conducting material capable of being used for X-ray detection is well known, as well as how to arrange electrode contacts and oxide passivated zones.

However, the composite detecting member 15 is believed to be new, at least as applied in a detection device of the type of interest here.

The detecting member 15 is mounted on its edge so as to become parallel to the incoming radiation (which is directed perpendicular to the longitudinal axis of the detection device 1 during normal operation). Thereby, the detecting member 15 achieves an almost constant sensitivity, independent of which side is irradiated. The detecting member 15 may display a small change in sensitivity caused by the non-symmetrical (non-circular) rotation geometry, but in most cases this change is not significant (less than 1%). The quadratic shape of the detecting member 15 simplifies the fabrication and saves semiconductor material in comparison to a rotation symmetrical detector, i.e. a circular detecting member.

The thickness of the electrode contacts 22, 24 should be as small as possible. The detector should be carefully aligned during mounting in the detector holder, which in the example shown is the rear dose adjusting element 10b.

The term density variation is here used to denote a region with a density that differs from the density of adjacent regions. In the example shown the density varies in the axial direction of the device 1.

The invention is not limited by the embodiments described above but can be modified in various ways within the scope of the claims. For instance, that the tissue equivalent material of the dose adjusting member 10 surrounds the detecting member 15 does not necessarily mean that the detecting member is completely surrounded by such material, but that tissue equivalent material surrounds the detecting member sufficiently well to provide a surrounding to the detecting member 15 that scatters X-rays in a way that sufficiently well corresponds to how tissue scatters X-rays.

Moreover, it is not necessary that the shielding member 6 is an aluminium cylinder. Its shielding functions can be performed by e.g. an electrically conducting and light shielding film arranged around the dose adjusting element 10a, 10b. Further, it is also possible to use an individual component for each function, i.e. one component that provides an electric shield and another component that protects the detecting member 15 from being exposed to light.

PMMA is a common material to choose as tissue equivalent material in the type of application described here. Other plastic material may also be used. Ordinary water is a suitable tissue equivalent material but is likely to require further components for supporting the detecting member 15.

The density variation in the region close to the detecting member 15 does not necessarily have to be achieved by removing material, such as the cut-out 21 in the dose adjusting element 10 or a complementing or alternative cut-out in the shielding member 6. Another possibility, which may be combined with removal of material, is to add material. However, removing of material is generally advantageous because additional material interacts with X-rays which may affect the dose measurements.

The invention claimed is:

1. X-ray detection device, comprising:
    a semiconducting X-ray detecting member provided with first and second electrode contacts;
    first and second electric wires connected to the first and second electrode contacts, respectively;
    a dose adjusting element arranged to surround the detecting member; and
    a shielding member configured to provide an electric shield for the detecting member and to protect the detecting member from being exposed to light,
    wherein the first electrode contact is positioned on the same side of the detecting member as the second electrode contact,
    wherein the detecting member has a flat shape with two main, substantially parallel surfaces,
    wherein the first and second electrode contacts are positioned on one of said main surfaces, and
    wherein the device has an elongated shape, wherein the detecting member is arranged such that the main surfaces face in a longitudinal direction of the device.

2. X-ray detection device according to claim 1, wherein an electrically non-conducting oxide passivation zone is provided between the first and second electrode contacts.

3. X-ray detection device according to claim 1, wherein the device is provided with a density variation in a region close to the detecting member.

4. X-ray detection device according to claim 3, wherein the density variation is achieved by providing a cavity that surrounds the detecting member.

5. X-ray detection device according to claim 4, wherein the cavity has an annular shape and surrounds the detecting member in a radial direction of the device.

6. X-ray detection device according to claim 4, wherein the dose adjusting element surrounds the detecting member and wherein the cavity is formed by a cut-out in the dose adjusting element.

7. X-ray detection device according to claim 1, wherein the detecting member is arranged in a cavity provided in the dose adjusting element.

8. X-ray detection device according to claim 1, wherein the dose adjusting element is made of polymethyl methacrylate (PMMA).

9. X-ray detection device according to claim 1, wherein the shielding member is made of aluminium.

10. X-ray detection device according to claim 9, wherein the shielding member has the shape of a cylinder.

11. X-ray detection device according to claim 1, wherein a silicon substrate forms a main body of the detecting member.

12. The X-ray detection device according to claim 1, wherein the dose adjusting element comprises a tissue equivalent material.

* * * * *